(12) United States Patent
Lee et al.

(10) Patent No.: US 10,840,274 B2
(45) Date of Patent: Nov. 17, 2020

(54) THIN FILM TRANSISTOR AND DISPLAY DEVICE

(71) Applicant: LG DISPLAY CO., LTD., Seoul (KR)

(72) Inventors: SangGul Lee, Seoul (KR); SangHee Yu, Paju-si (KR); GwangTae Kim, Daegu (KR); YeonTaek Yoo, Paju-si (KR); NamSu Kim, Paju-si (KR); SukHo Cho, Paju-si (KR); Hoon Choi, Goyang-si (KR); HyunJin Shin, Anyang-si (KR); HwaChun Lim, Bucheon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/755,458

(22) PCT Filed: May 20, 2016

(86) PCT No.: PCT/KR2016/005357
§ 371 (c)(1),
(2) Date: Feb. 26, 2018

(87) PCT Pub. No.: WO2017/034122
PCT Pub. Date: Mar. 2, 2017

(65) Prior Publication Data
US 2018/0286891 A1    Oct. 4, 2018

(30) Foreign Application Priority Data

Aug. 26, 2015  (KR) .......................... 10-2015-0120262
Apr. 29, 2016  (KR) .......................... 10-2016-0053556

(51) Int. Cl.
*G02F 1/1333*   (2006.01)
*H01L 27/12*    (2006.01)
(Continued)

(52) U.S. Cl.
CPC ........ *H01L 27/1248* (2013.01); *G02F 1/1368* (2013.01); *G02F 1/133345* (2013.01);
(Continued)

(58) Field of Classification Search
CPC ....... G02F 2001/133357; G02F 1/1368; G02F 1/133345; G02F 1/134309;
(Continued)

(56) References Cited

U.S. PATENT DOCUMENTS

2003/0160247 A1    8/2003  Miyazawa
2006/0008932 A1*   1/2006  Oh ...................... G02F 1/13454
                                              438/34
(Continued)

FOREIGN PATENT DOCUMENTS

JP    2003-195775 A      7/2003
KR    10-2004-0042274 A  5/2004
(Continued)

*Primary Examiner* — Michael H Caley
*Assistant Examiner* — Mariam Qureshi
(74) *Attorney, Agent, or Firm* — Seed IP Law Group LLP

(57) ABSTRACT

In an exemplary embodiment of the present disclosure, a thin film transistor including a gate electrode, an active layer, a source electrode, and a drain electrode on a non-pixel area of a substrate includes a first insulating layer that insulates the gate electrode from the source electrode and the drain electrode, and a second insulating layer that covers the source electrode and the drain electrode. According to an exemplary embodiment of the present disclosure, the first insulating layer and the second insulating layer are configured so as not to be extended to a pixel area of the substrate in order to reduce possible oscillation of transmittance depending on a viewing angle which occurs when a specific light of a light source passes through the pixel area.

24 Claims, 11 Drawing Sheets

(51) Int. Cl.
  *G02F 1/1368* (2006.01)
  *G02F 1/1343* (2006.01)
  *H01L 29/786* (2006.01)
  *G02F 1/1362* (2006.01)
  *G02F 1/13357* (2006.01)

(52) U.S. Cl.
  CPC .... *G02F 1/134309* (2013.01); *H01L 27/1225* (2013.01); *G02F 1/136227* (2013.01); *G02F 2001/133357* (2013.01); *G02F 2001/133614* (2013.01); *G02F 2001/134372* (2013.01); *H01L 29/7869* (2013.01)

(58) Field of Classification Search
  CPC ..... G02F 2001/133388; H01L 27/1225; H01L 27/1248
  See application file for complete search history.

(56) References Cited

U.S. PATENT DOCUMENTS

| | | | |
|---|---|---|---|
| 2007/0030867 A1 | 2/2007 | Park et al. | |
| 2009/0135316 A1* | 5/2009 | Horikoshi | G02B 5/3083 349/5 |
| 2009/0225251 A1* | 9/2009 | Kaitoh | G02F 1/1303 349/46 |
| 2011/0090438 A1 | 4/2011 | Lee | |
| 2012/0001191 A1* | 1/2012 | Ma | G02F 1/136213 257/71 |
| 2013/0169901 A1* | 7/2013 | Kim | H01L 29/78633 349/43 |
| 2014/0175442 A1* | 6/2014 | Kwack | H01L 27/124 257/59 |
| 2015/0171118 A1* | 6/2015 | Shim | H01L 27/1248 257/72 |
| 2015/0228869 A1* | 8/2015 | Yoo | H01L 33/54 362/97.3 |
| 2016/0380004 A1* | 12/2016 | Lee | H01L 27/1225 349/46 |
| 2017/0062580 A1* | 3/2017 | Hayashi | H01L 29/4908 |
| 2017/0184893 A1* | 6/2017 | Saitoh | G02F 1/1368 |
| 2017/0242179 A1* | 8/2017 | Satake | G02B 6/005 |

FOREIGN PATENT DOCUMENTS

| | | |
|---|---|---|
| KR | 10-2007-0016723 A | 2/2007 |
| KR | 10-2008-0024762 A | 3/2008 |

* cited by examiner

THIN FILM TRANSISTOR AND DISPLAY DEVICE

BACKGROUND

Technical Field

The present disclosure relates to a thin film transistor and a display device, and more particularly to a thin film transistor and a display device which has reduced deterioration of display quality depending on a viewing angle by improving an insulating layer structure provided in a pixel area of a liquid crystal panel in a structure in which a specific light including a plurality of peak wavelengths is supplied to the liquid crystal panel in order to implement high resolution.

Description of the Related Art

Display apparatuses are configured to display an image and have been widely used for various devices such as televisions, mobile devices, notebook computers, vehicles, watches, etc.

A liquid crystal display apparatus (LCD) as one of the display apparatuses is driven according to an image displaying principle based on optical anisotropy and polarization of liquid crystals. The LCD includes a liquid crystal panel manufactured by bonding two substrates with a liquid crystal layer interposed therebetween as an essential component, and realizes a difference in transmittance by generating an electric field within the liquid crystal panel and thus changing an alignment direction of liquid crystal molecules.

However, the liquid crystal panel does not include a self-luminous element. Therefore, in order to display a difference in transmittance in an image, the liquid crystal panel needs a separate light source that emits a white light. As a light source of the LCD, a cold cathode fluorescent lamp (CCFL), an external electrode fluorescent lamp (EEFL), or a light emitting diode (LED) may be used. Particularly, the LED has advantages of small size, low power consumption, high reliability, etc. and thus has been widely used as a light source of the LCD.

BRIEF SUMMARY

Technical Problem

A light source of a liquid crystal display apparatus including a light emitting diode may be generally formed of a blue light emitting diode and a yellow fluorescent material. More specifically, a part of a blue light emitted from the blue light emitting diode is absorbed by the yellow fluorescent material and then converted into a yellow light, and the yellow light converted by the yellow fluorescent material is mixed with the rest of the blue light which is not absorbed by the fluorescent material so as to implement a white light. The white light may include both a blue peak wavelength and a yellow peak wavelength. The white light incident into a liquid crystal panel passes through red, green, and blue color filters so as to be implemented by red, green, and blue pixels, respectively.

However, if the white light including a blue peak wavelength and a yellow peak wavelength is used as described above, it is difficult to implement high resolution and high color reproduction of the liquid crystal display apparatus. The details thereof are as follows.

The peak wavelength refers to a wavelength at which the intensity of light is higher in a specific wavelength range than in the other wavelength ranges. Therefore, in the white light including a blue peak wavelength and a yellow peak wavelength, a blue light and a yellow light may have a higher intensity than other color lights.

That is, the white light has a high intensity in a blue wavelength range, i.e., the blue light has a high intensity. Thus, when the white light passes through a blue color filter, light loss by the blue color filter can be reduced.

In comparison, the white light also has a relatively high intensity in a yellow wavelength range, i.e., a red light or a green light has a lower intensity than the yellow light. Thus, when the white light passes through a red color filter or a green color filter, light loss may occur. In other words, the red color filter or the green color filter transmits only a light having a wavelength range corresponding thereto, and, thus, the red or green color filter blocks the yellow light having a high intensity but transmits only a red light or green light having a low intensity. Therefore, the light efficiency of a red or green pixel is decreased, so that it may be difficult to implement high resolution or high color reproduction of a display device.

The inventors of the present disclosure recognized that if a white light of a light source has a peak wavelength in a wavelength range corresponding to each color filter, light loss by a color filter can be reduced, so that it becomes easy to implement high resolution or high color reproduction of a display device. That is, if a white light has a high intensity in all of a red wavelength range, a green wavelength range, and a blue wavelength range, light loss by red, green, and blue color filters can be reduced.

The inventors of the present disclosure manufactured a light source configured to emit a white light having a uniformly high intensity at red, green, and blue peak wavelengths by using a blue light emitting diode, a red fluorescent material, and a green fluorescent material. During this process, the inventors of the present disclosure recognized that it is difficult to control each of a wavelength of the blue light emitting diode, a wavelength of the red fluorescent material, and a wavelength of the green fluorescent material or mix their colors and also difficult to implement desired characteristics of a peak wavelength due to material limitations of the red fluorescent material or green fluorescent material. Specifically, the inventors of the present disclosure recognized that it is difficult to regulate the intensity or full width at half maximum (FWHM) of each peak wavelength to a desired value in manufacturing.

For example, when a light source configured to emit a white light including red, green, and blue peak wavelengths is manufactured to implement high resolution and high color reproduction, the FWHM of a red light may have a much smaller value than the FWHM of a green light or blue light due to material limitations of a light emitting diode or fluorescent materials. When the FWHM of a light is decreased, the light may be greatly shifted or the intensity of the light may be decreased depending on a viewing angle for the liquid crystal panel, so that the viewing angle dependence may be increased.

Particularly, the liquid crystal panel has a structure including a plurality of thin film layers such as a metal layer or an insulating layer. As described above, if a white light including a red peak wavelength with a narrow FWHM passes through the liquid crystal panel, color separation of a red light depending on a viewing angle may be further increased due to a difference in refractive index between the thin film layers. The color separation refers to a phenomenon in which the transmittance of a specific light oscillates depending on a viewing angle and a color seems to be separated, and as a difference in refractive index between thin film layers is increased or a FWHM of a light is decreased, the color separation may be rapidly increased. That is, as for a red light having a narrow FWHM compared with a blue light or green light having a relatively large FWHM, oscillation of transmittance depending on a viewing angle may be further increased due to a difference in refractive index between the thin film layers, and, thus, oscillation of color reproduction depending on a viewing angle may be increased, which may result in deterioration of display quality of a display device.

Accordingly, the inventors of the present disclosure recognized the above-described problems and invented a novel thin film transistor and a display device which is improved in deterioration of display quality depending on a viewing angle even if one of red, green, and blue peak wavelengths has a very narrow FWHM due to material limitations of fluorescent materials in a structure in which a white light having the characteristics of light required to implement high resolution, e.g., all of red, green, and blue peak wavelengths is supplied to a liquid crystal panel.

An object of the present disclosure is to provide a thin film transistor and a display device which is improved in oscillation of transmittance and color reproduction depending on a viewing angle by improving an insulating layer structure provided in a pixel area of a liquid crystal panel when one of a plurality peak wavelengths has a much narrower FWMM than the other peak wavelengths in a structure in which a white light including the plurality of peak wavelengths is supplied to the liquid crystal panel in order to implement high resolution or high color reproduction.

The objects of the present disclosure are not limited to the aforementioned objects, and other objects, which are not mentioned above, will be apparent to a person having ordinary skill in the art from the following description.

Technical Solution

In order to achieve the above object, an exemplary embodiment of the present disclosure provides a display device including a liquid crystal panel including a pixel area and a non-pixel area, and a light source configured to supply a specific light to the liquid crystal panel. The specific light includes a first peak wavelength and a second peak wavelength having a full width at half maximum which is 25% or less of a full width at half maximum of the first peak wavelength. The liquid crystal panel includes a thin film transistor including a gate electrode, an active layer, a source electrode, and a drain electrode on a non-pixel area of a substrate, an insulating layer structure including at least one of a first insulating layer that insulates the gate electrode from the source electrode and the drain electrode of the thin film transistor, a second insulating layer that covers the source electrode and the drain electrode of the thin film transistor, and a third insulating layer that has a flat top surface on the second insulating layer, and an electrode unit configured to drive a liquid crystal layer on the insulating layer structure. According to an exemplary embodiment of the present disclosure, an insulating layer structure in the pixel area is configured differently from an insulating layer structure in the non-pixel area in order to reduce possible oscillation of transmittance depending on a viewing angle when the specific light of the light source passes through the pixel area. Accordingly, oscillation of color reproduction of the display device depending on a viewing angle can be reduced, so that deterioration of display quality of the display device can be improved.

In an exemplary embodiment of the present disclosure, a thin film transistor including a gate electrode, an active layer, a source electrode, and a drain electrode on a non-pixel area of a substrate includes a first insulating layer that insulates the gate electrode from the source electrode and the drain electrode, and a second insulating layer that covers the source electrode and the drain electrode. According to an exemplary embodiment of the present disclosure, the first insulating layer and the second insulating layer are configured so as not to be extended to a pixel area of the substrate in order to reduce possible oscillation of transmittance depending on a viewing angle which occurs when a specific light of a light source passes through the pixel area.

In another exemplary embodiment of the present disclosure, a display device includes a substrate having an active area including an opening area configured to transmit a light and a non-opening area adjacent to the opening area and configured not to transmit a light and a non-active area which is adjacent to the active area and in which a gate-in-panel is disposed, a first sub-insulating layer disposed in the non-opening area of the active area and in the non-active area and having a first refractive index, and a second sub-insulating layer disposed in the entire active area and the entire non-active area and having a second refractive index lower than the first refractive index. Therefore, the display device according to another exemplary embodiment of the present disclosure can reduce deterioration of electrical characteristics which may be caused by a defect of an active layer formed of oxide semiconductor, and, thus, display quality of the display device can be improved.

Effect

According to an exemplary embodiment of the present disclosure, in a structure in which a specific light including a plurality of peak wavelengths is supplied to a liquid crystal panel in order to implement high resolution, if there is a big difference in a full width at half maximum (FWHM) between the peak wavelengths of the specific light, an insulating layer structure provided in a pixel area of the liquid crystal panel is improved, so that color separation at a peak wavelength having a relatively narrow FWHM can be reduced.

Accordingly, oscillation of transmittance of the specific light depending on a viewing angle can be reduced.

Further, oscillation of color reproduction of a display device depending on a viewing angle can be reduced, so that deterioration of display quality of the display device can be solved.

Furthermore, reliability of the display device can be improved by minimizing an electrical defect of an active layer formed of oxide semiconductor and oscillation of transmittance of the specific light depending on a viewing angle can also be reduced.

The effects of the present disclosure are not limited to the above-described effects, and other effects, which are not mentioned above, will be apparent to a person having ordinary skill in the art from the following description.

The objects to be achieved by the present disclosure, the aspects, and the effects of the present disclosure described above do not specify essential features of the claims, and, thus, the scope of the claims is not limited to the disclosure of the present disclosure.

DETAILED DESCRIPTION

Figure 1:
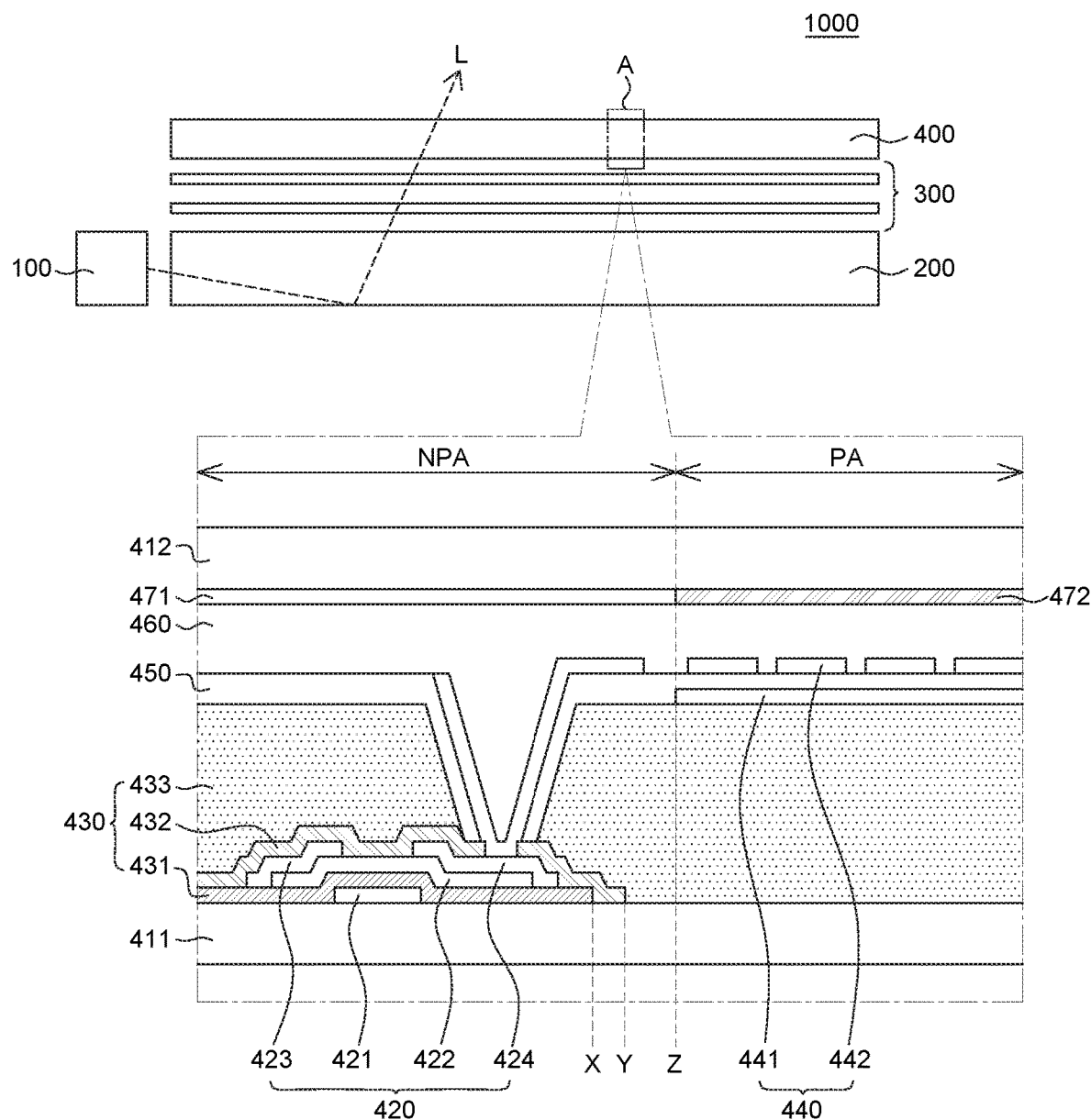
FIG. 1 provides a cross-sectional view and an enlarged view illustrating a display device according to an exemplary embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like shown in the accompanying drawings for describing the exemplary embodiments of the present disclosure are merely examples, and the present disclosure is not limited thereto. Like reference numerals generally denote like elements throughout the present specification. Further, in the following description, a detailed explanation of well-known related technologies may be omitted to avoid unnecessarily obscuring the subject matter of the present disclosure.

The terms such as "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," "next" and the like, one or more parts may be positioned between the two parts unless the terms are used with the term "immediately" or "directly."

When the time sequence between two or more incidents is described using the terms such as "after," "subsequent to," "next to," and "before," two or more incidents may be inconsecutive unless the terms are used with the term "immediately" or "directly."

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Since the size and thickness of each component illustrated in the drawings are represented for convenience in explanation, the present disclosure is not necessarily limited to the illustrated size and thickness of each component.

The features of various exemplary embodiments of the present disclosure can be partially or entirely bonded to or combined with each other and can be interlocked and operated in technically various ways as can be fully understood by a person having ordinary skill in the art, and the various exemplary embodiments can be carried out independently of or in association with each other.

Hereinafter, various exemplary embodiments of the present disclosure will be described in detail with reference to the accompanying drawings.

FIG. 1 provides a cross-sectional view and an enlarged view illustrating a display device 1000 according to an exemplary embodiment of the present disclosure. Referring to FIG. 1, the display device 1000 includes a light source 100, a light guide plate 200, an optical sheet 300, and a liquid crystal panel 400.

The liquid crystal panel 400 is a component configured to display an image on the display device 1000, and has a structure in which a liquid crystal layer 460 is interposed between two substrates 411 and 412. The liquid crystal panel 400 is driven using the principle of change of alignment direction of liquid crystal molecules in the liquid crystal layer 460 due to an electric field applied between two electrodes 441 and 442. When a light L of the light source 100 passing through the light guide plate 200 is supplied to the liquid crystal panel 400, the amount of light to be transmitted is regulated depending on an alignment direction of liquid crystal molecules in the liquid crystal layer 460, so that a desired image can be displayed. The light L of the light source 100 incident into the liquid crystal panel 400 passes through a color filter 472, for example, red, green, and blue color filters, of the liquid crystal panel 400 so as to be implemented by red, green, and blue pixels, respectively. The liquid crystal layer 460 may be vertically aligned or horizontally aligned depending on a driving mode.

The light guide plate 200 is disposed under the liquid crystal panel 400, and the light L of the light source 100 incident into a lateral side of the light guide plate 200 is dispersed to the entire top surface of the light guide plate 200 and then supplied to the liquid crystal panel 400. The light guide plate 200 may be formed of a transparent material, for example, any one of polyolefine, polystyrene, polymethyl methacrylate (PMMA), polycarbonate (PC), silicon rubber, and glass.

The optical sheet 300 is disposed between the liquid crystal panel 400 and the light guide plate 200, and it is a layer configured to increase the efficiency or brightness of the light L incident into the liquid crystal panel 400. The optical sheet 300 may include, for example, a prism sheet or a diffuser sheet. The prism sheet functions to refract or concentrate the light L emitted toward the top surface of the light guide plate 200 using a prism-shaped layer and thus increase the brightness of the light L incident into the liquid crystal panel 400. The diffuser sheet functions to uniformly disperse the light L emitted toward the top surface of the light guide plate 200 and thus equalize the brightness of the light L.

The light source 100 is disposed on a lateral side of the light guide plate 200 as illustrated in FIG. 1, and the light L emitted from the light source 100 is supplied to the liquid crystal panel 400 through the light guide plate 200 and the optical sheet 300. The light source 100 of the display device 1000 according to an exemplary embodiment of the present disclosure is configured to emit a white light including a plurality of peak wavelengths, and may be formed of, for example, a combination of a light emitting diode and at least one fluorescent material. The characteristics of the specific light L emitted from the light source 100 will be described with reference to FIG. 2.

Figure 2:
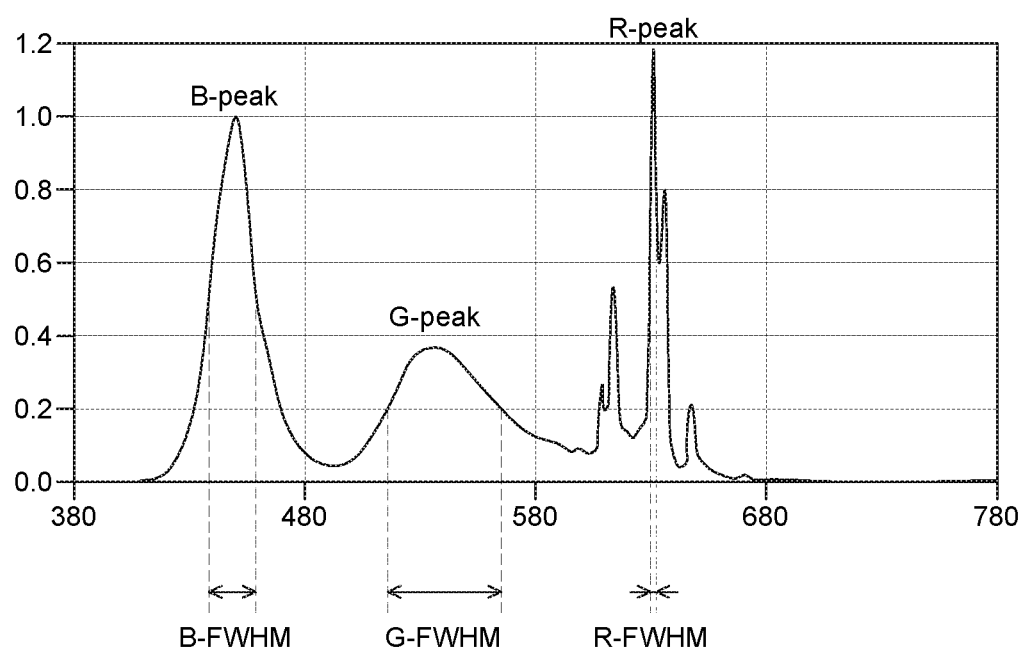
FIG. 2 is a graph showing a spectrum of a specific light of a light source according to an exemplary embodiment of the present disclosure.

FIG. 2 is a graph showing a spectrum of the specific light L of the light source 100 of the display device 1000 according to an exemplary embodiment of the present disclosure. Specifically, FIG. 2 shows a wavelength-intensity spectrum of the specific light L emitted from the light source 100 of the display device 1000 according to an exemplary embodiment of the present disclosure.

Referring to FIG. 2, the specific light L emitted from the light source 100 includes a plurality of peak wavelengths and specifically, includes peak wavelengths in a red wavelength range (e.g., 600 nm or more to 650 nm or less), a green wavelength range (e.g., 520 nm or more to 560 nm or less), and a blue wavelength range (e.g., 430 nm or more to 480 nm or less). The peak wavelength refers to a wavelength at which the intensity of light is higher than that in the other wavelength ranges. That is, in the specific light L of the light source 100, a red light, a green light, and a blue light have a high intensity and these lights are mixed so as to emit a white light.

Therefore, when the specific light L of the light source 100 passes through a color filter 472, specifically the red, green, and blue color filters, of the liquid crystal panel 400 illustrated in FIG. 1, light loss which may be caused by the color filter 472 can be reduced, so that it becomes easy to implement high resolution and high color reproduction of the display device 1000. The light source 100 may be manufactured using a light emitting diode and at least one fluorescent material, e.g., a blue light emitting diode, a red fluorescent material, and a green fluorescent material.

As described above, it may be difficult to control each wavelength of the light emitting diode and the fluorescent materials, or mix their colors and also difficult to regulate characteristics, specifically the intensity or full width at half maximum (FWHM), of a desired peak wavelength due to material limitations of the fluorescent materials in manufacturing. Therefore, as illustrated in FIG. 2, one of the plurality of peak wavelengths, e.g., a peak wavelength of a red light may have a much narrower FWHM than the other peak wavelengths. The full width at half maximum (FWHM) refers to a wavelength width at a point where an intensity becomes half of the maximum intensity of a peak wavelength.

Referring to FIG. 2, the specific light L has a peak wavelength G-peak at about 447 nm in the blue wavelength range, and a full width at half maximum (FWHM) B-FWHM of the corresponding peak wavelength has a value of about 20 nm. Further, the specific light L has a peak wavelength G-peak at about 538 nm in the green wavelength range, and a full width at half maximum (FWHM) G-FWHM of the corresponding peak wavelength has a value of about 54 nm. Furthermore, the specific light L has a peak wavelength R-peak at about 631 nm in the red wavelength range, and a full width at half maximum (FWHM) R-FWHM of the corresponding peak wavelength has a value of about 4 nm, which is relatively very narrow compared with the peak wavelength G-peak of the green light or the peak wavelength B-peak of the blue light. That is, the R-FWHM of the peak wavelength of the red light has a value of 25% or less of the G-FWHM of the peak wavelength of the green light or the B-FWHM of the peak wavelength of the blue light, so that it is deemed as being formed relatively very narrow.

As described above, if an FWHM of a peak wavelength of a light has a relatively very small value, the light may be greatly shifted or the intensity of the light may be decreased depending on a viewing angle for the liquid crystal panel 400, so that the viewing angle dependence may be increased.

The display device 1000 according to an exemplary embodiment of the present disclosure can reduce the viewing angle dependence by improving an insulating layer structure of the liquid crystal panel 400 even if the light source 100 emitting the specific light L including a peak wavelength with a narrow FWHM as described above is applied due to difficulty in manufacturing. The details thereof will be described with reference to FIG. 1 again.

Referring to FIG. 1, the liquid crystal panel 400 includes a first substrate 411, a thin film transistor 420, an insulating layer structure 430, an electrode unit 440, a liquid crystal layer 460, a black matrix 471, the color filter 472, and a second substrate 412.

The first substrate 411 or the second substrate 412 of the liquid crystal panel 400 includes a pixel area PA and a non-pixel area NPA. The pixel area PA refers to an area of a minimum unit for actually emitting a light, and the pixel area PA is separated between the two adjacent pixel areas PAs. Further, the pixel area PA is an area where a light is emitted, and may be referred to as an opening area. The non-pixel area NPA is an area where a light is not emitted, and may be referred to as a non-opening area. The pixel area PA may be referred to as a sub-pixel or a pixel. Although not illustrated in the drawing, a plurality of pixel areas PAs may form a minimum group for expressing a white light. For example, three pixels may form a group, and a red pixel, a green pixel, and a blue pixel may form a group. In this case, the color filter 472 for converting the white light L of the light source 100 into a light suitable for each pixel may be disposed on each pixel, and a red color filter, a green color filter, and a blue color filter may be disposed on the respective pixels.

The first substrate 411 or the second substrate 412 may be formed of an insulating material, and may be formed as a flexible film formed of, e.g., glass or a polyimide-based material.

The thin film transistor 420 is disposed in the non-pixel area NPA of the first substrate 411. The thin film transistor 420 supplies a signal to the electrode unit 440 that drives the liquid crystal layer 460.

The thin film transistor 420 includes a gate electrode 421, an active layer 422, a source electrode 423, and a drain electrode 424. Referring to FIG. 1, the gate electrode 421 is formed on the first substrate 411 and a first insulating layer covers the gate electrode 421. The active layer 422 is disposed on the first insulating layer 431 so as to be overlapped with the gate electrode 421, and the source electrode 423 and the drain electrode 424 are disposed to be spaced from each other on the active layer 422.

In the present specification, an overlap of two objects may mean that at least parts of the two objects are overlapped in a vertical relation between the two objects regardless of whether or not another object is present therebetween, and may also be referred to using various other terms.

The gate electrode 421, the source electrode 423, and the drain electrode 424 may be formed of a conductive material, e.g., any one of molybdenum (Mo), aluminum (Al), chromium (Cr), gold (Au), titanium (Ti), nickel (Ni), neodymium (Nd), and copper (Cu), or an alloy thereof, but are not limited thereto, and may be formed of various materials.

The active layer 422 may be formed of any one of oxide semiconductors, such as InGaZnO, InGaO, and InSnZnO, but is not limited thereto.

At least one insulating layer disposed between the first substrate 411 and the electrode unit 440 may be referred to as the insulating layer structure 430. Referring to FIG. 1, the insulating layer structure 430 may include at least one of the first insulating layer 431, a second insulating layer 432, or a third insulating layer 433.

The first insulating layer 431 is disposed on the gate electrode 421 and insulates the gate electrode 421 from the active layer 422, or the gate electrode 421 from the source electrode 423 and the drain electrode 424. The first insulating layer 431 may be referred to as a gate insulating layer.

The second insulating layer 432 is configured to protect the thin film transistor 420 and disposed to cover the source electrode 423 and the drain electrode 424. The second insulating layer 432 may be referred to as a passivation layer.

The first insulating layer 431 and the second insulating layer 432 may include a single layer formed of an inorganic material, e.g., silicon nitride ($SiN_x$). FIG. 1 illustrates that the first insulating layer 431 and the second insulating layer 432 of the liquid crystal panel 400 include a single layer, but the present disclosure is not limited thereto. In other words, the first insulating layer 431 and the second insulating layer 432 may include a plurality of layers.

If the first insulating layer 431 and the second insulating layer 432 include a plurality of layers, they may have a double-layered structure of silicon nitride (SiNx) and silicon oxide ($SiO_2$). In particular, if the active layer 422 is formed of an oxide semiconductor, electrical characteristics may be greatly changed due to adsorption/desorption of oxygen ($O_2$) in the air or hydrogen (H) supplied from moisture due to the characteristic of the oxide semiconductor. In order to suppress the change of electrical characteristics of the oxide semiconductor, silicon nitride (SiNx) with excellent barrier property may be disposed. However, the silicon nitride (SiNx) may change the characteristics of the oxide semiconductor due to hydrogen supplied during deposition. Therefore, in order to reduce such a change, a silicon oxide film ($SiO_2$) may be further provided. The exemplary embodiment in which the first insulating layer 431 and the second insulating layer 432 include a plurality of layers as described above will be described in more detail with reference to FIG. 6 through FIG. 9. The third insulating layer 433 having a flat top surface is disposed on the second insulating layer 432. The third insulating layer 433 may include a single layer or a plurality of layers formed of an organic material, e.g., polyaluminum chloride (PAC), polyimide, or acryl. The third insulating layer 433 may be referred to as a planarization layer.

The second insulating layer 432 and the third insulating layer 433 include a contact portion that exposes the drain electrode 424, and the electrode unit 440 and the thin film transistor 420 are electrically connected through the contact portion. Although not illustrated in the drawing, the second insulating layer 432 and the third insulating layer 433 may include a contact portion that exposes the source electrode 423, depending on the kind of the thin film transistor 420.

The insulating layer structure 430 of the display device 1000 according to an exemplary embodiment of the present disclosure includes at least one of the first insulating layer 431, the second insulating layer 432, and the third insulating layer 433. The insulating layer structure 430 is configured differently in the pixel area PA than in the non-pixel area NPA, so that the viewing angle dependence in a structure in which the specific light L including a peak wavelength with a narrow FWHM is supplied to the liquid crystal panel 400 can be reduced.

As described above, if the specific light L of the light source 100 passes through the liquid crystal panel 400, color separation depending on a viewing angle may be further increased due to a difference in refractive index between a plurality of thin film layers of the liquid crystal panel 400, i.e., a plurality of insulating layers included in the insulating layer structure 430. In particular, the color separation depending on a viewing angle may be rapidly increased when a light has a peak wavelength with a narrow FWHM. The color separation refers to a phenomenon in which the transmittance of a specific light oscillates depending on a viewing angle and a color seems to be separated, and as a difference in refractive index between thin film layers is increased or a FWHM of a light is decreased, the color separation may be rapidly increased. That is, as for a red light having a narrow FWHM from among the plurality of peak wavelengths included in the specific light L of the light source 100 described in FIG. 2 compared with a blue light or green light having a relatively large FWHM, oscillation of transmittance depending on a viewing angle may be further increased due to a difference in refractive index between the thin film layers. Thus, color separation of the red light may be further increased and oscillation of color reproduction depending on a viewing angle may also be increased, which may result in deterioration of display quality of the display device 1000.

In an exemplary embodiment of the present disclosure, the insulating layer structure is configured differently in the pixel area PA than in the non-pixel area NPA. Thus, even if a red light having a narrow FWHM passes through the pixel area PA, the oscillation of transmittance depending on a viewing angle can be reduced. Specifically, a difference in refractive index between a plurality of insulating layers corresponding to the pixel area PA can be reduced, and, thus, even if a red light passes through the pixel area PA, the oscillation of transmittance depending on a viewing angle can be reduced. In other words, the insulating layer structure 430 in the pixel area PA includes only insulating layers having a refractive index substantially identical to that of the first substrate 411, and, thus, a difference in refractive index between the insulating layers in the pixel area PA can be reduced. Herein, two layers being substantially identical to each other in refractive index means that refractive indexes between materials respectively constituting the two layers are substantially identical to each other. Specifically, when a difference in refractive index between the materials is 0.05 or less, the refractive indexes of the two layers may be regarded as substantially identical to each other.

If the first substrate 411 is formed of glass, a refractive index of the first substrate 411 is about 1.5, and if the first insulating layer 431 and the second insulating layer 432 are formed of silicon nitride (SiNx), a refractive index of the first insulating layer 431 and the second insulating layer 432 is about 1.88. Further, if the third insulating layer 433 is formed of photo acryl compound (PAC), a refractive index of the third insulating layer 433 is about 1.5. In this case, if a red light having a narrow FWHM passes through the first substrate 411, the first insulating layer 431, the second insulating layer 432, and the third insulating layer 433 corresponding to the pixel area PA, oscillation of transmittance of the red light depending on a viewing angle may be increased due to a difference in refractive index between the first substrate 411 and the first insulating layer 431 and a difference in refractive index between the second insulating layer 432 and the third insulating layer 433.

Therefore, as illustrated in FIG. 1, if the first insulating layer 431 and the second insulating layer 432 are removed from the pixel area PA, i.e., if the first insulating layer 431 and the second insulating layer 432 are disposed only in the non-pixel area NPA but not extended to the pixel area PA, there is almost no difference in refractive index between insulating layers in the pixel area PA. Thus, even if a red light having a narrow FWHM passes through the pixel area PA, oscillation of transmittance depending on a viewing angle can be reduced. Accordingly, color separation and oscillation of color reproduction depending on a viewing angle can be decreased, and deterioration of display quality of the display device 1000 can be solved.

The electrode unit 440 configured to drive the liquid crystal layer 460 is disposed on the insulating layer structure 430. The electrode unit 440 includes a common electrode 441 and a pixel electrode 442 patterned on the common electrode 441. A fourth insulating layer 450 may be disposed between the common electrode 441 and the pixel electrode 442. In an exemplary embodiment of the present disclosure, the pixel area PA and the non-pixel area NPA may be separated by an end Z of the common electrode 441, and the end of the common electrode 441 may be a boundary line Z that separates the pixel area PA from the non-pixel area NPA. However, the present disclosure is not necessarily limited thereto. The pixel area PA and the non-pixel area NPA may be separated by a boundary line between the black matrix 471 and the color filter 472 or may be separated by only an end of the black matrix 471 depending on a design of the liquid crystal panel 400. Further, although it is illustrated in the drawing that the pixel electrode 442 is disposed on the common electrode 441, the common electrode 441 may be disposed on the pixel electrode 442 or the common electrode 441 and the pixel electrode 442 may be disposed on the same plane depending on a driving method of the liquid crystal layer 460.

Referring to FIG. 1, an end Y of the second insulating layer 432 is located closer to the boundary surface Z between the pixel area PA and the non-pixel area NPA or end Z of the common electrode 441 than an end X of the first insulating layer 431, i.e., the second insulating layer 432 disposed in the non-pixel area is configured to cover a lateral surface of the first insulating layer 431. Thus, an infiltration path of external moisture ($H_2O$) or hydrogen ($H_2$) through an interface between layers is increased. Therefore, the thin film transistor 420 can be protected more effectively. However, the present disclosure is not limited thereto. The first insulating layer 431 and the second insulating layer 432 may be removed at the same time depending on a manufacturing method, so that and the end X of the first insulating layer 431 and the end Y of the second insulating layer 432 may be located on the same plane.

FIG. 1 illustrates the thin film transistor 420 in the non-pixel area NPA of the first substrate 411 as having a staggered structure, but the present disclosure is not limited thereto, and the thin film transistor 420 may have a coplanar structure. If the thin film transistor 420 has a coplanar structure, it has a structure in which an active layer, a gate insulating layer, a gate electrode, an interlayer insulating layer, a source electrode, and a drain electrode are laminated in sequence. In this case, if the gate insulating layer and the interlayer insulating layer are formed of a material different from the first substrate 411 in refractive index, the gate insulating layer and the interlayer insulating layer may be configured so as not to be extended to the pixel area PA. Therefore, even if a red light having a narrow FWHM passes through the pixel area PA, oscillation of transmittance depending on a viewing angle may be decreased, which results in a decrease in oscillation of color reproduction and thus reduces deterioration of display quality of the display device 1000. The gate insulating layer and the interlayer insulating layer may be referred to as the first insulating layer.

In an exemplary embodiment, the thin film transistor 420 located in the non-pixel area NPA of the first substrate 411 and including the gate electrode 421, the active layer 422, the source electrode 423, and the drain electrode 424 may be considered including the first insulating layer 431 insulating the gate electrode 421 from the source electrode 423 and the drain electrode 424 and the second insulating layer 432 covering the source electrode 423 and the drain electrode 424. In this case, the first insulating layer 431 and the second insulating layer 432 are configured so as not to be extended to the pixel area PA in order to reduce possible oscillation of transmittance depending on a viewing angle when the specific light L of the light source 100 passes through the pixel area PA of the first substrate 411. Therefore, color separation of a peak wavelength having a relatively narrow FWHM included in the specific light L of the light source 100 can be reduced, so that deterioration of display quality of the display device 1000 can be improved.

Figure 3:
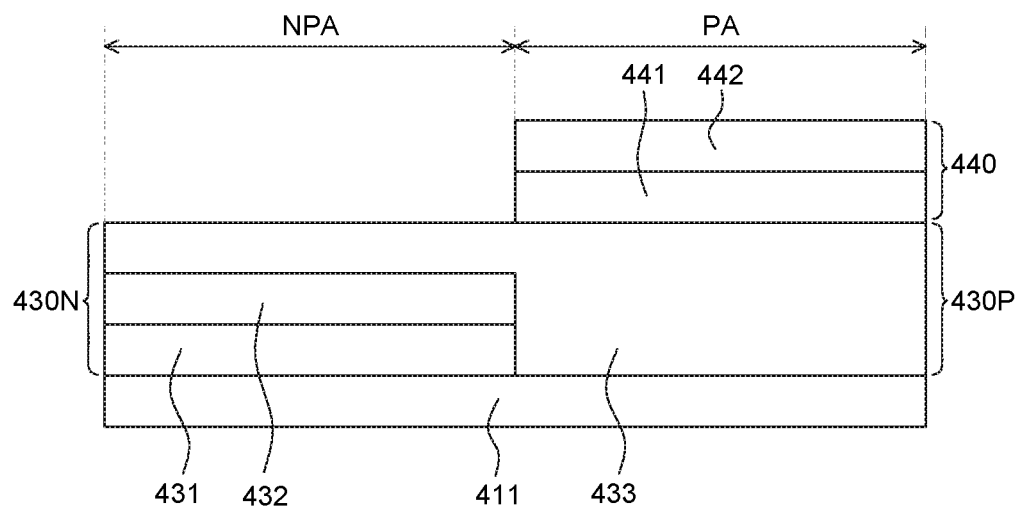
FIG. 3 is a cross-sectional view illustrating major components of a display device according to an exemplary embodiment of the present disclosure.

FIG. 3 is a cross-sectional view illustrating major components of the display device 1000 according to an exemplary embodiment of the present disclosure, and specifically, FIG. 3 is a cross-sectional view schematically comparing a laminating structure of the insulating layer structure 430 in the pixel area PA and the non-pixel area NPA.

Referring to FIG. 3, an insulating layer structure 430N in the non-pixel area NPA includes the first insulating layer 431, the second insulating layer 432, and the third insulating layer 433. In comparison with this, an insulating layer structure 430P in the pixel area PA includes only the third insulating layer 433 formed of a material substantially identical to the first substrate 411 in refractive index, and the first insulating layer 431 and the second insulating layer 432 formed of a material different from the first substrate 411 in refractive index are removed. Herein, the first insulating layer 431 and the second insulating layer 432 may be formed of, e.g., silicon nitride (SiNx).

That is, by removing the insulating layers formed of a material different from the first substrate 411 in refractive index from the pixel area PA among a plurality of insulating layers disposed on the first substrate 411, the number of insulating layers of the insulating layer structure 430P in the pixel area PA may be smaller than that of the insulating layer structure 430N in the non-pixel area NPA. Thus, there is no difference in refractive index between the first substrate 411 and the insulating layer corresponding to the pixel area PA, so that oscillation of transmittance of the specific light L including a peak wavelength with a narrow FWHM depending on a viewing angle can also be decreased.

As describe above with reference to FIG. 1 through FIG. 3, in the structure in which the specific light L including a first peak wavelength (e.g., a green peak wavelength or a blue peak wavelength) and a second peak wavelength (e.g., a red peak wavelength) having a FWHM which is 25% or less of a FWHM of the first peak wavelength is supplied to the liquid crystal panel 400 in order to implement high resolution and high color reproduction, the insulating layer structure 430P in the pixel area PA and the insulating layer structure 430N in the non-pixel area NPA are configured differently from each other in order to reduce possible oscillation of transmittance depending on a viewing angle when the specific light L of the light source passes through the pixel area PA of the liquid crystal panel 400, specifically to reduce oscillation of transmittance of a light (e.g., red light) having the second peak wavelength. That is, among the plurality of insulating layers included in the insulating layer structure 430, only a layer formed of a material substantially identical to the first substrate 411 in refractive index is disposed in the pixel area PA. Specifically, the first insulating layer 431 insulating the gate electrode 421 from the source electrode 423 and the drain electrode 424 of the thin film transistor 420 and the second insulating layer 432 covering the source electrode 423 and the drain electrode 424 are configured so as not to be extended to the pixel area PA. Therefore, oscillation of color reproduction of the display device 1000 depending on a viewing angle can be reduced, so that deterioration of display quality can be solved.

Figure 4A:
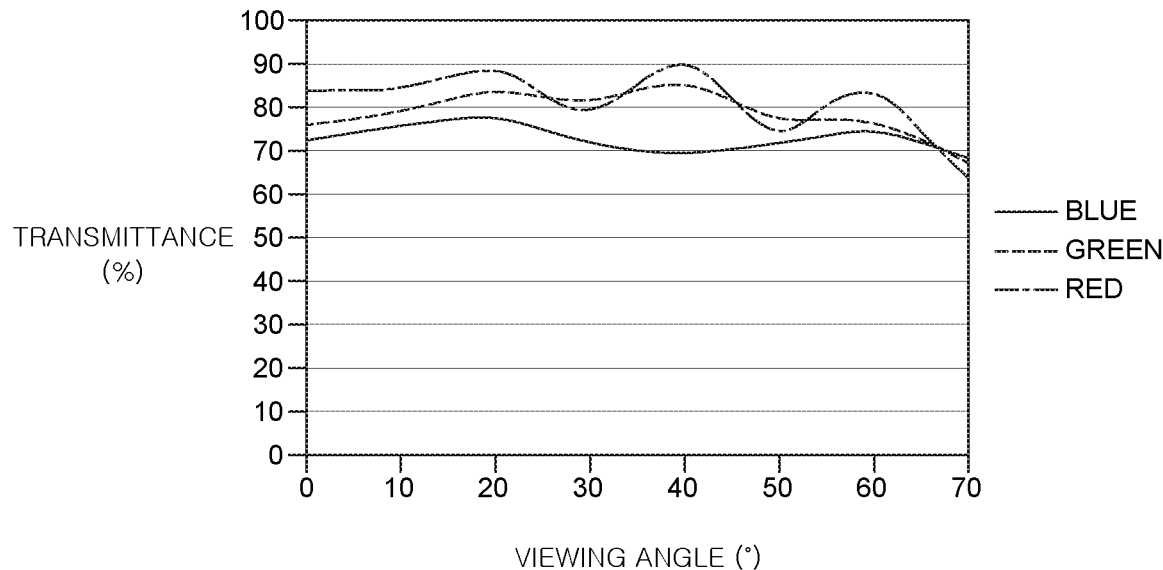
FIG. 4A and FIG. 4B are graphs showing oscillation of transmittance depending on a viewing angle according to Comparative Example and an exemplary embodiment of the present disclosure.
Figure 4B:
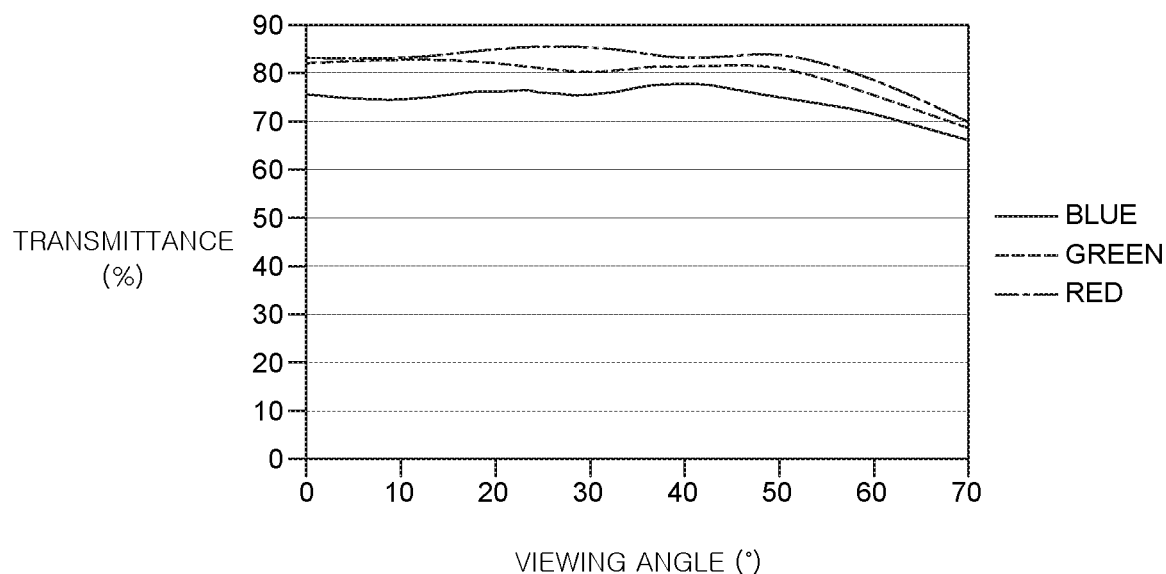

FIG. 4A and FIG. 4B are graphs showing oscillation of transmittance depending on a viewing angle according to Comparative Example and an exemplary embodiment of the present disclosure.

FIG. 4A is a graph showing oscillation of transmittance depending on a viewing angle in the case where a structure of Comparative Example is applied. FIG. 4 shows peak wavelengths in a red wavelength range, a green wavelength range, and a blue wavelength range. Referring to FIG. 4, a specific light in which a peak wavelength in the red wavelength range has a narrower FWHM than peak wavelengths in the other wavelength ranges is incident into a liquid crystal panel. The structure of Comparative Example is a structure of a display device in which an insulating layer structure in a pixel area has the same structure as an insulating layer structure in a non-pixel area. FIG. 4A shows oscillation of transmittance of a red light RED, a green light GREEN, and a blue light BLUE depending on a viewing angle when the above-described light of Comparative Example is incident. In other words, FIG. 4A is a graph showing oscillation of transmittance depending on a viewing angle of a display device in which the first insulating layer and the second insulating layer described above with reference to FIG. 1 through FIG. 3 are disposed in a non-pixel area and a pixel area.

Referring to FIG. 4A, the blue light BLUE has the maximum transmittance of about 79% and the minimum transmittance of about 70% at a viewing angle between 0 degree to 70 degrees and an oscillation difference of about 9%. Further, the green light GREEN has the maximum transmittance of about 85% and the minimum transmittance of about 69% at a viewing angle between 0 degree to 70 degrees and an oscillation difference of about 16%. The red light RED has the maximum transmittance of about 90% and the minimum transmittance of about 62% at a viewing angle between 0 degree to 70 degrees and an oscillation difference of about 28%. Thus, it can be seen that the red light RED has the oscillation difference about 3.1 times and about 1.75 times greater than the blue light BLUE and the green light GREEN, respectively. Further, as shown in FIG. 4A, it can be seen that when a viewing angle is changed, vertical vibration in transmittance of the red light RED occurs more frequently than the blue light BLUE or the green light GREEN.

Meanwhile, FIG. 4B is a graph showing oscillation of transmittance depending on a viewing angle in the case where a structure of an exemplary embodiment of the present disclosure is applied. Like the structure of Comparative Example, an incident light has peak wavelengths in a red wavelength range, a green wavelength range, and a blue wavelength range and a peak wavelength in the red wavelength range has a narrower FWHM than peak wavelengths in the other wavelength ranges. FIG. 4B shows oscillation of transmittance of the red light RED, the green light GREEN, and the blue light BLUE depending on a viewing angle when such a specific light is incident into a display device having a structure in which an insulating layer structure in a pixel area is configured differently from an insulating layer structure in a non-pixel area. In other words, FIG. 4B is a graph showing oscillation of transmittance depending on a viewing angle of the display device in which the first insulating layer and the second insulating layer described above with reference to FIG. 1 through FIG. 3 are disposed only in the non-pixel area but not extended to a pixel area.

Referring to FIG. 4B, the blue light BLUE has the maximum transmittance of about 78% and the minimum transmittance of about 68% at a viewing angle between 0 degree to 70 degrees and an oscillation difference of about 10%. Further, the green light GREEN has the maximum transmittance of about 82% and the minimum transmittance of about 69% at a viewing angle between 0 degree to 70 degrees and an oscillation difference of about 13%. The red light RED has the maximum transmittance of about 85% and the minimum transmittance of about 70% at a viewing angle between 0 degree to 70 degrees and an oscillation difference of about 15%. That is, it can be seen that the blue light BLUE, the green light GREEN, and the red light RED have similar transmittance oscillation differences. Further, as shown FIG. 4B, it can be seen that when a viewing angle is changed, curves of vertical vibration in transmittance of the blue light BLUE, the green light GREEN, and the red light RED also have similar forms. In other words, it can be seen that in a display device in which an insulating layer structure in a pixel area is configured differently from an insulating layer structure in a non-pixel area according to an exemplary embodiment of the present disclosure, if a specific light in which a peak wavelength in a red wavelength range has a narrower FWHM than peak wavelengths in the other wavelength ranges is incident into a liquid crystal panel, curves of transmittance oscillation of the light in the red wavelength range, the green wavelength range, and the blue wavelength range in the pixel area depending on a viewing angle have similar forms.

Therefore, referring to FIG. 4A and FIG. 4B, it can be seen that since the first insulating layer and the second insulating layer of the display device according to an exemplary embodiment of the present disclosure are configured so as not to be extended to the pixel area, there is an effect of decreasing possible oscillation of transmittance depending on a viewing angle when a specific light including a peak wavelength with a narrow FWHM passes through the pixel area.

Figure 5A:
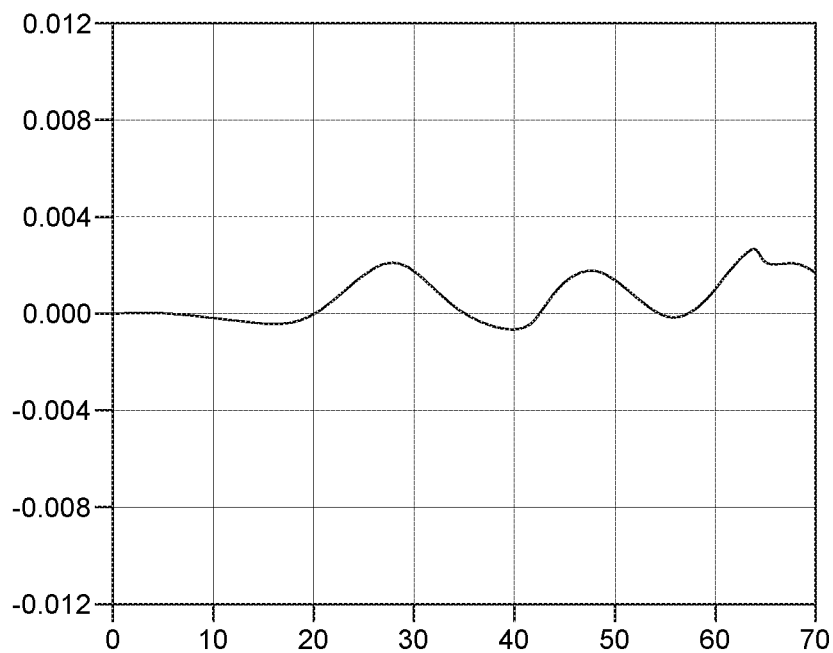
FIG. 5A and FIG. 5B are graphs showing a variance in color coordinate depending on a viewing angle according to Comparative Example and an exemplary embodiment of the present disclosure.
Figure 5B:
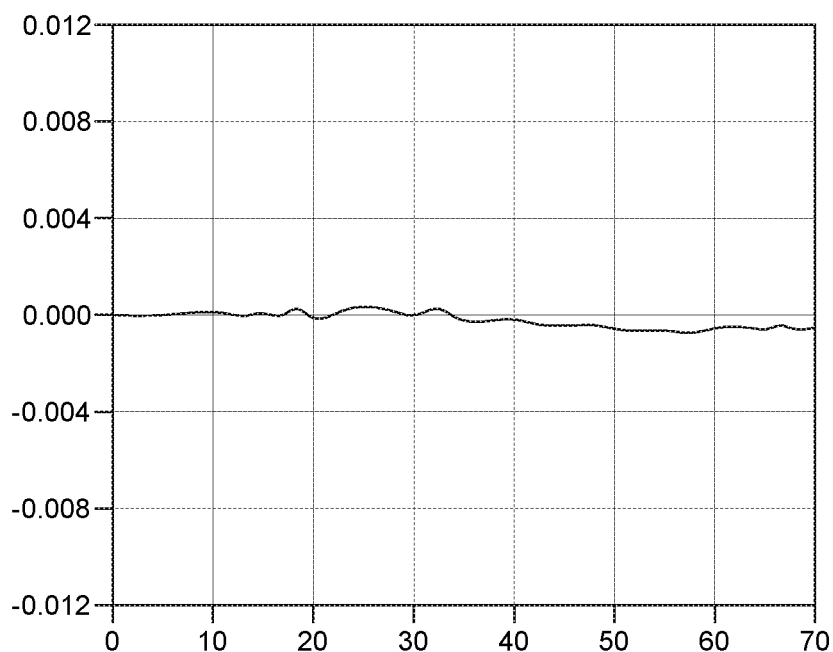

FIG. 5A and FIG. 5B are graphs showing a variance in color coordinate depending on a viewing angle according to Comparative Example and an exemplary embodiment of the present disclosure.

A display device used in FIG. 5A has the structure of Comparative Example described above with reference to FIG. 4A. Specifically, FIG. 5A is a graph showing a variance (Δu') in color coordinate depending on a viewing angle of the display device in which an insulating layer structure in a pixel area has the same structure as an insulating layer structure in a non-pixel area. It can be seen that if a specific white light which includes peak wavelengths in a red wavelength range, a green wavelength range, and a blue wavelength range and in which a peak wavelength in the red wavelength range has a narrower FWHM than peak wavelengths in the other wavelength ranges is supplied to the display device having the structure of Comparative Example, color coordinates are greatly changed as a viewing angle is changed, as shown in FIG. 5A. That is, as described above, it can be seen that color separation of the specific light depending on a viewing angle is increased due to a difference in refractive index between thin film layers included in the insulating layer structure in the pixel area, and, thus, color coordinates are greatly changed as a viewing angle is changed. Therefore, oscillation of color reproduction depending on a viewing angle is increased, which may result in deterioration of display quality of the display device.

Meanwhile, a display device used in FIG. 5B has the structure of an exemplary embodiment of the present disclosure described above with reference to FIG. 4B. Specifically, FIG. 5B is a graph showing a variance (Δu') in color coordinate depending on a viewing angle of the display device in which a first insulating layer and a second insulating layer are disposed only in a non-pixel area but not extended to a pixel area. Likewise, it can be seen that if a specific white light which includes peak wavelengths in a red wavelength range, a green wavelength range, and a blue wavelength range and in which a peak wavelength in the red wavelength range has a narrower FWHM than peak wavelengths in the other wavelength ranges is supplied to the display device having the structure of the exemplary embodiment, a variation in color coordinate is decreased as a viewing angle is changed, as shown in FIG. 5B.

Therefore, it can be seen that since an insulating layer structure in a pixel area is configured differently from an insulating layer structure in a non-pixel area, there is almost no change in color coordinate depending on a viewing angle which may occur when a specific light passes through the pixel area, so that oscillation of color reproduction depending on a viewing angle is decreased and display quality of the display device is improved.

Meanwhile, as described above, a first insulating layer and a second insulating layer of a liquid crystal panel may include a single layer formed of silicon nitride (SiNx) with excellent barrier property. However, in order to improve characteristics of an active layer, the first insulating layer and the second insulating layer may be formed of silicon oxide ($SiO_2$) in addition to silicon nitride (SiNx).

The first insulating layer and the second insulating layer including a plurality of layers as such will be described in more detail with reference to FIG. 6 through FIG. 10.

Figure 6:
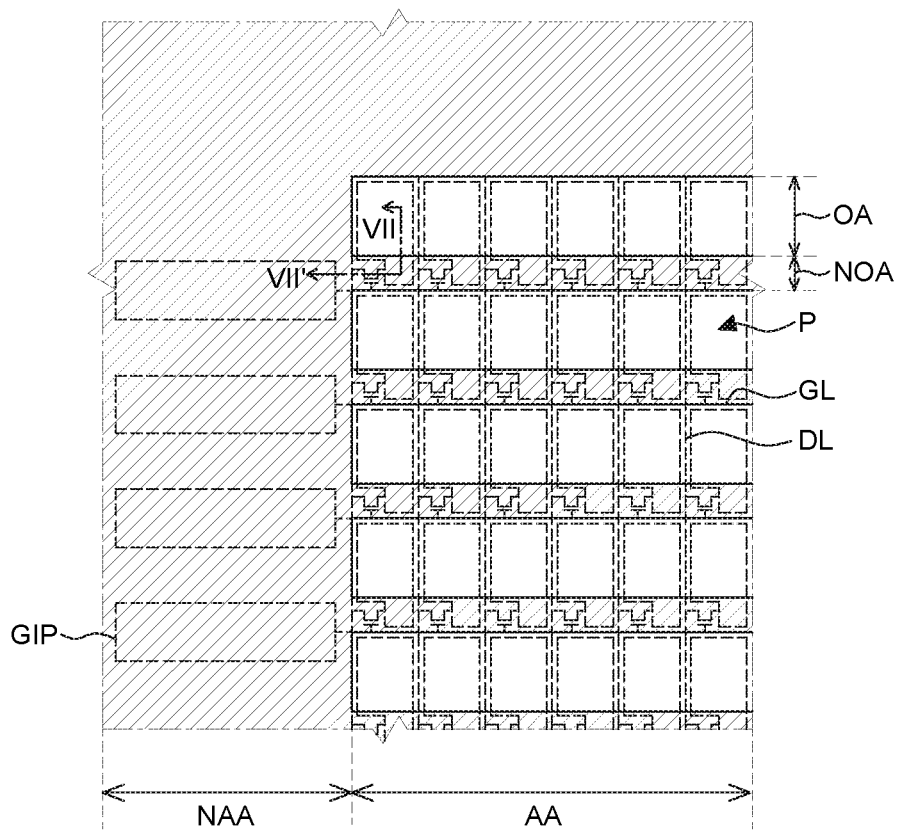
FIG. 6 is a plan view illustrating a display device according to another exemplary embodiment of the present disclosure.

FIG. 6 is a plan view illustrating a display device according to another exemplary embodiment of the present disclosure.

Referring to FIG. 6, a display device 600 according to another exemplary embodiment of the present disclosure includes an active area AA which displays an image and a non-active area NAA which does not display an image and is disposed at the periphery of the active area AA.

In the active area AA, a plurality of data lines DL and a plurality of gate lines GL may be disposed and pixels P may be defined by the plurality of data lines DL and the plurality of gate lines GL. Each pixel P includes an opening area OA configured to transmit a light and a non-opening area NOA adjacent to the opening area OA and configured not to transmit a light.

In the opening area OA, a pixel electrode is disposed, and the opening area OA refers to an area of a minimum unit for a light from a light source to actually pass through. The opening area OA may correspond to the pixel area PA of FIG. 1. Therefore, a detailed explanation of the opening area OA will be omitted.

The non-opening area NOA is an area where a driving thin film transistor for driving a pixel electrode is disposed and a light does not pass through. The non-opening area NOA may correspond to the non-pixel area NPA of FIG. 1. Therefore, a detailed explanation of the non-opening area NOA will be omitted.

The non-active area NAA is disposed adjacent to the active area AA, and a gate-in-panel GIP connected to a plurality of gate lines GL is disposed in the non-active area NAA.

In the display device 600 according to another exemplary embodiment of the present disclosure, an insulating layer structure disposed in the non-active area NAA, an insulating layer structure disposed in the non-opening area NOA of the active area AA, and an insulating layer structure disposed in the opening area OA of the active area AA are configured differently from each other. Therefore, there is almost no change in color coordinate depending on a viewing angle which may occur when a specific light passes through the opening area OA. Therefore, oscillation of color reproduction depending on a viewing angle is decreased, and, thus, display quality of the display device can be improved. Also, electrical characteristics of an active layer formed of oxide semiconductor disposed in the non-active area NAA and the non-opening area NOA of the active area AA are not changed, and, thus, reliability of the display device can be improved.

The structures of the active area AA and the non-active area NAA of the display device 600 according to another exemplary embodiment of the present disclosure will be described in more detail with reference to FIG. 7 through FIG. 9.

Figure 7:
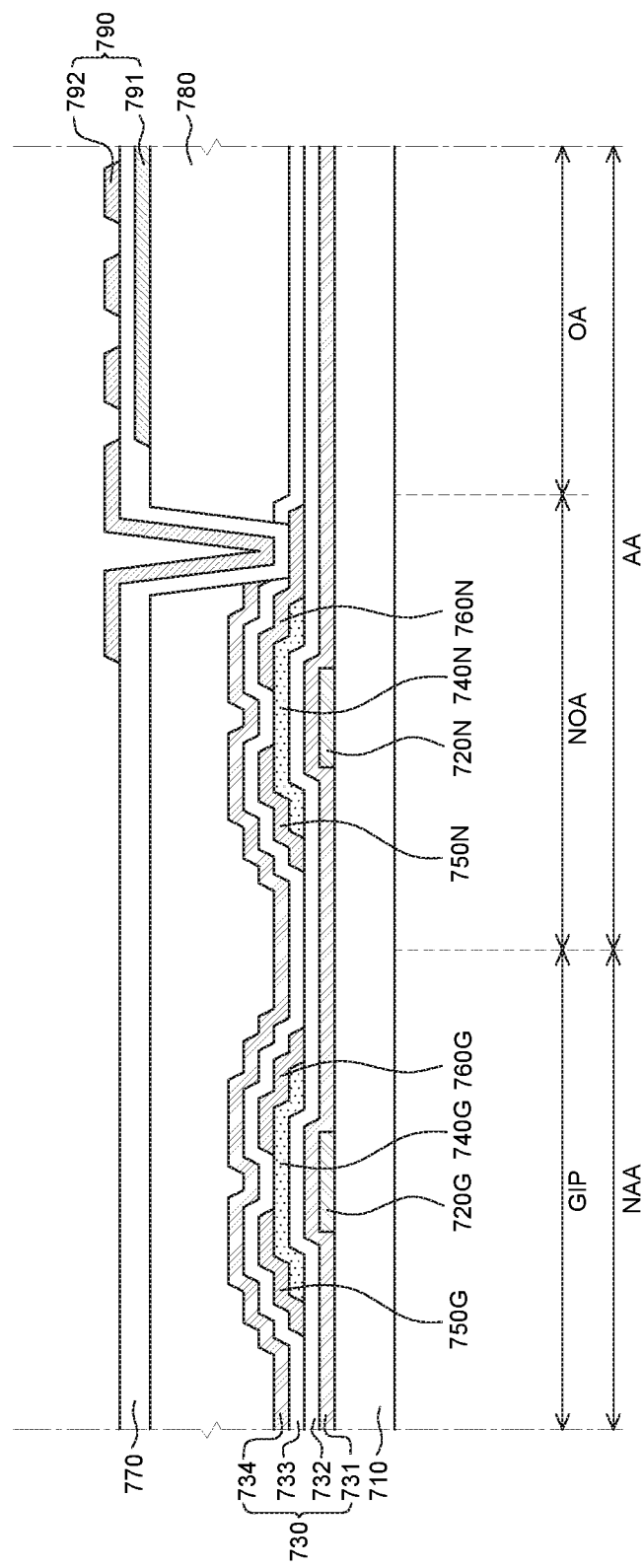
FIG. 7 through FIG. 9 are cross-sectional views of display devices taken along a line VII-VII' of FIG. 6 according to various exemplary embodiments.
Figure 8:
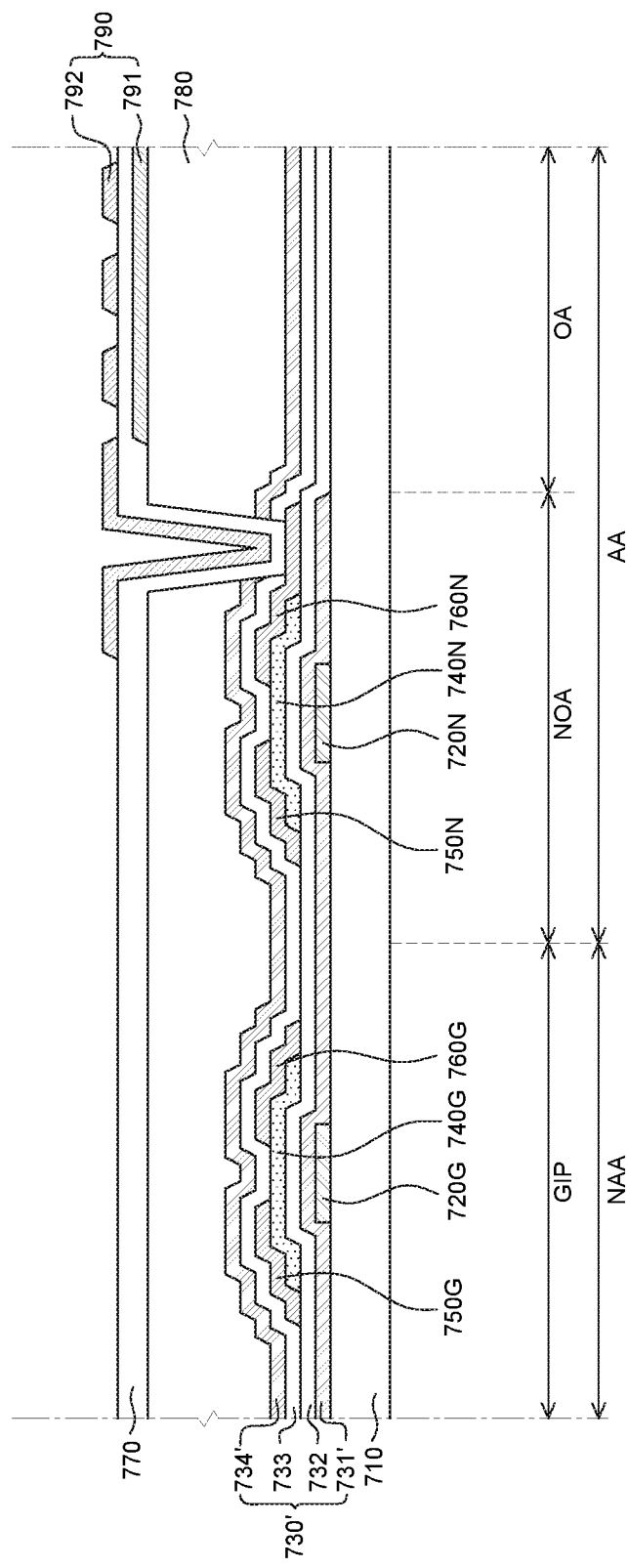
Figure 9:
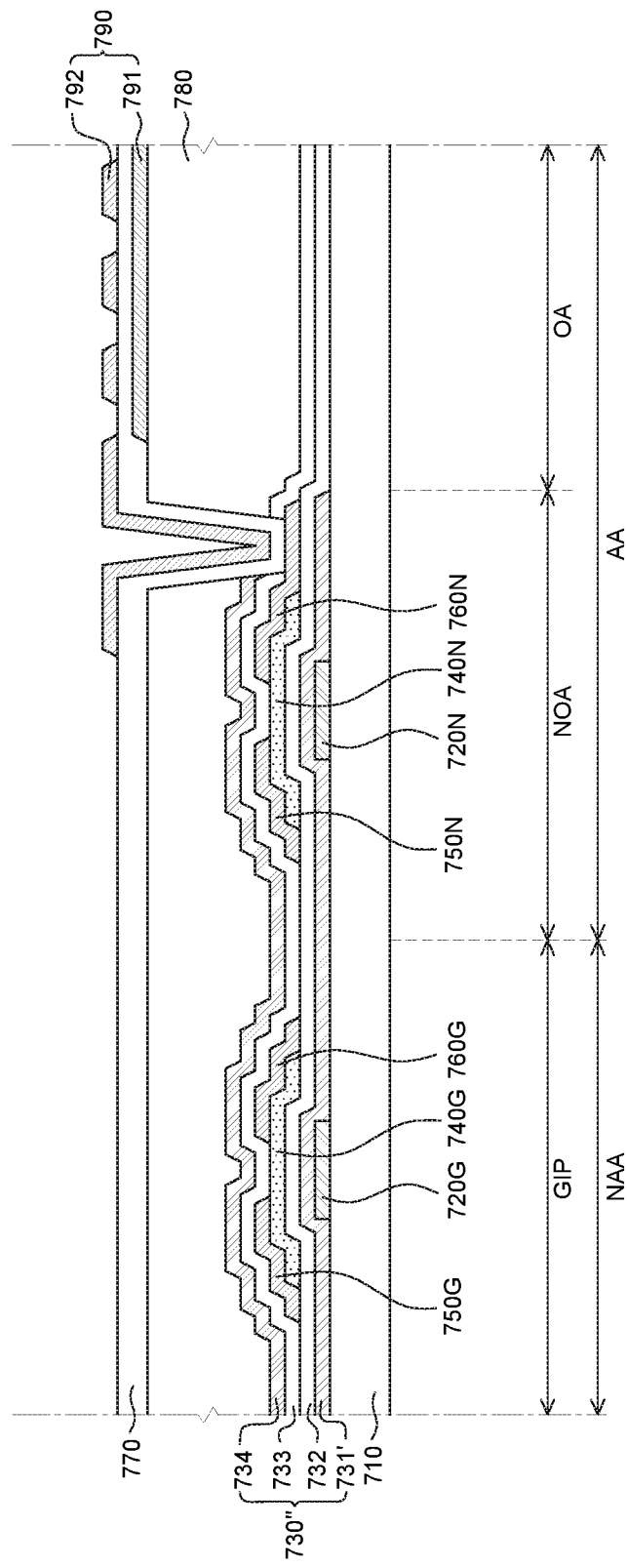

FIG. 7 through FIG. 9 are cross-sectional views of display devices taken along a line VII-VII' of FIG. 6 according to various exemplary embodiments.

Referring to FIG. 7 first, a thin film transistor is disposed in the non-opening area NOA of the active layer AA and the non-active area NAA. The thin film transistor includes gate electrodes 720G and 720N, active layers 740G and 740N, source electrodes 750G and 750N, drain electrodes 760G and 760N, and an insulating layer structure 730. In this case, the thin film transistor illustrated in FIG. 7 includes the same components as the thin film transistor illustrated in FIG. 1 except the insulating layer structure 730. Therefore, a detailed explanation thereof will be omitted. Meanwhile, a reference numeral 770 which is not yet explained denotes an interlayer insulating layer for insulating a common electrode 791 and a pixel electrode 792 disposed in the opening area OA, and a reference numeral 780 denotes the third insulating layer, i.e., planarization layer, illustrated in FIG. 1. FIG. 1 illustrates that a third insulating layer is also included in an insulating layer structure. However, according to another exemplary embodiment, only a first insulating layer and a second insulating layer will be described as being included in the insulating layer structure.

The insulating layer structure 730 includes a plurality of first sub-insulating layers 731 and 734 and a plurality of second sub-insulating layers 732 and 733.

The plurality of first sub-insulating layers 731 and 734 is disposed only over the non-opening area NOA of the active area AA and the non-active area NAA. The plurality of first sub-insulating layers 731 and 734 may be formed of silicon nitride (SiNx) having a first refractive index.

The plurality of first insulating layers 731 and 734 may be a first insulating layer disposed between the gate electrode 720G of the non-active area NAA and the gate electrode 720N in the non-opening area NOA of the active area AA and between the active layer 740G of the non-active area NAA and the active layer 740N in the non-opening area NOA of the active area AA, i.e., one of a plurality of sub-insulating layers constituting a gate insulating layer. Further, the plurality of first sub-insulating layers 731 and 734 may be a second insulating layer configured to protect the thin film transistor disposed in the non-active area NAA and the non-opening area NOA of the active area AA, i.e., one of a plurality of sub-insulating layers constituting a passivation layer.

Particularly, the plurality of first sub-insulating layers 731 and 734 includes a first sub-insulating layer 731 constituting a gate insulating layer over the non-opening area NOA of the active area AA and the entire non-active area NAA and a first sub-insulating layer 734 constituting a passivation layer over the non-opening area NOA of the active area AA and the entire non-active area NAA. That is, in the non-opening area NOA of the active area AA and the non-active area NAA, a plurality of first sub-insulating layers 731 and 734 may be disposed. This is because the active layers 740G and 740N according to an exemplary embodiment of the present disclosure are formed of oxide semiconductor.

More specifically, electrical characteristics of the oxide semiconductors 740G and 740N may be changed due to adsorption/desorption of oxygen ($O_2$) in the air or hydrogen (H) supplied from moisture, and, thus, silicon nitride (SiNx) with excellent barrier property is disposed on and under the active layers 740G and 740N.

Meanwhile, in the opening area OA of the active area AA, the plurality of first sub-insulating layers 731 and 734 is not disposed, but only one first sub-insulating layer 731 can be disposed. That is, the first sub-insulating layer 731 may be disposed in the entire non-active area NAA and the entire active area AA, but the first sub-insulating layer 734 may not be disposed in the opening area OA of the active area AA. This is because the opening area OA of the active area AA transmits a light, and, thus, if the plurality of first sub-insulating layers 731 and 734 having a higher refractive index than the second sub-insulating layers 732 and 733 is disposed, there may be an increase in the number of interfaces with a difference in refractive index and a light may be reflected between the first sub-insulating layers 731 and 734, so that oscillation of color impression may be increased and display quality may deteriorate.

The plurality of second sub-insulating layers 732 and 733 is disposed in the entire non-active area NAA and the entire active area AA. The plurality of second sub-insulating layers 732 and 733 may be formed of silicon oxide ($SiO_2$) having a second refractive index lower than the first refractive index. The third insulating layer 780 is substantially identical to the plurality of second sub-insulating layers 732 and 733 in refractive index. Thus, even if a red light passes through, oscillation of transmittance depending on a viewing angle can be reduced.

The second sub-insulating layer 732 may be a first insulating layer disposed between the gate electrode 720G and the active layer 740G of the non-active area NAA and between the gate electrode 720N and the active layer 740N in the non-opening area NOA of the active area AA, i.e., one of a plurality of sub-insulating layers constituting the gate insulating layer. Further, the second sub-insulating layer 733 may be a second insulating layer configured to protect the thin film transistor disposed in the non-active area NAA and the non-opening area NOA of the active area AA, i.e., one of a plurality of sub-insulating layers constituting the passivation layer.

Further, the plurality of second sub-insulating layers 732 and 733 may be configured so as not to be disposed in the opening area OA of the active area AA in the same manner as the above-described exemplary embodiment, but may be disposed in the entire substrate 710 including the opening area OA of the active area AA. Silicon nitride (SiNx) constituting the first sub-insulating layers 731 and 734 is generally deposited by PECVD. During deposition thereof, hydrogen (H) may be introduced, as described above. If hydrogen (H) is introduced, electrical characteristics of the active layers 740G and 740N formed of oxide semiconductor may deteriorate. Thus, in order to suppress the deterioration, the second sub-insulating layers 732 and 733 are interposed between the active layers 740G and 740N and the first sub-insulating layers 731 and 734 on the basis of the active layers 740G and 740N. Meanwhile, a part of the second sub-insulating layer 733 may be removed at the same time when the first sub-insulating layer 734 is removed from the opening area OA.

Further, since the plurality of second sub-insulating layers 732 and 733 has a refractive index identical to that of the substrate 710 and the third insulating layer 780, even if the plurality of second sub-insulating layers 732 and 733 is disposed in the opening area OA of the active area AA, display quality of the display device 600 may be not much influenced.

In the exemplary embodiment illustrated in FIG. 7, only one first sub-insulating layer 731 constituting the gate insulating layer is disposed in the opening area OA of the active area AA. Meanwhile, in the exemplary embodiment illustrated in FIG. 8, only the first sub-insulating layer 734 constituting the passivation layer among the plurality of first sub-insulating layers 731 and 734 is disposed in the opening area OA of the active area AA.

That is, referring to FIG. 8, a first sub-insulating layer 731' constituting a first insulating layer among a plurality of first sub-insulating layers 731' and 734' is not disposed in the opening area OA of the active area AA, but a first sub-insulating layer 734' constituting a second insulating layer is disposed in the opening area OA of the active area AA.

As described above, the plurality of first sub-insulating layers 731' and 734' is disposed in the non-active area NAA and the non-opening area NOA of the active area AA, and only one first sub-insulating layer 731' or 734'' among the plurality of first sub-insulating layers 731' and 734' is disposed in the opening area OA of the active area AA. Thus, there may be a decrease in the number of interface with a difference in refractive index between a material of the first sub-insulating layers 731' and 734' and the second sub-insulating layers 732 and 734', the substrate 710, and the third sub-insulating layer 780, so that deterioration of display quality of the display device 600 can be reduced.

Further, the plurality of second sub-insulating layers 732 and 733 may be disposed in the entire non-active area NAA and the entire active area AA. Thus, deterioration of electrical characteristics of the active layers 740G and 740N which may be caused by the properties of the material of the first sub-insulating layers 731' and 734' can be reduced.

Referring to FIG. 9, only the plurality of second sub-insulating layers 732 and 733 is disposed in the opening area OA of the active area AA in FIG. 9 as compared with FIG. 7 and FIG. 8.

As illustrated in FIG. 9, if only the plurality of second sub-insulating layers 732 and 733 is disposed in the opening area OA of the active area AA, the first sub-insulating layers 731' and 734 having a high refractive index is not disposed in the opening area OA of the active area AA. Therefore, the number of interfaces with a difference in refractive index between the substrate 710, the second sub-insulating layers 732 and 733, and the third insulating layer 780 can be reduced, so that display quality property can be further improved.

Meanwhile, in FIG. 7 through FIG. 9, removal of the first sub-insulating layers 731 and 734 only from the opening area OA of the active area AA among the active area AA and the non-active area NAA of the substrate 710 may be performed by, but not limited to, dry etching using a mask.

In this case, among the plurality of first sub-insulating layers 731 and 734, a layer to be removed may not be removed to an end of the non-opening area NOA of the active area AA, but may be further extended to the inside of the opening area OA beyond a boundary between the non-opening area NOA and the opening area OA. In this case, a length of the first sub-insulating layers 731 and 734 to be further extended to the opening area OA may be determined on the basis of color coordinates of the pixel P. That is, a part of the first sub-insulating layers 731 and 734 can be further extended to the inside of the opening area OA as long as the color coordinates of the pixel P are within a required range. Thus, while the color coordinates of the pixel P are satisfied, reliability of the oxide semiconductor can be further improved.

Figure 10A:
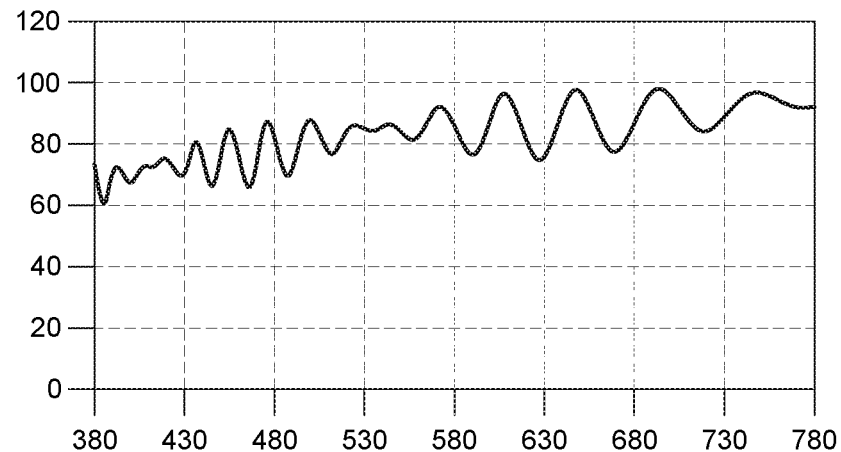
FIG. 10A and FIG. 10B are graphs showing a change in color coordinate depending on a viewing angle according to Comparative Example and another exemplary embodiment of the present disclosure.
Figure 10B:
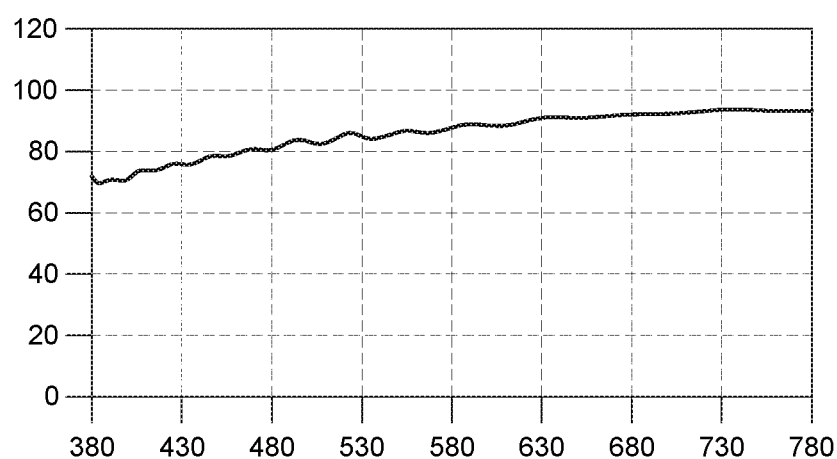

FIG. 10A and FIG. 10B are graphs showing a change in color coordinate depending on a viewing angle according to Comparative Example and another exemplary embodiment of the present disclosure.

In a display device used in FIG. 10A, all of a plurality of first sub-insulating layers are disposed in the opening area OA of the active area AA. That is, FIG. 10A is a graph showing a variance in color coordinate depending on a viewing angle of the display device in which an insulating layer structure disposed in the opening area OA of the active area AA has the same structure as an insulating layer structure disposed in the non-active area NAA and the non-opening area NOA of the active area AA. It can be seen that if a specific white light which includes peak wavelengths in a red wavelength range, a green wavelength range, and a blue wavelength range and in which a peak wavelength in the red wavelength range has a narrower FWHM than peak wavelengths in the other wavelength ranges is supplied to the display device having the structure of Comparative Example, color coordinates are greatly changed as a viewing angle is changed, as shown in FIG. 10A. That is, as described above, it can be seen that color separation of the specific light depending on a viewing angle is increased due to a difference in refractive index between a plurality of thin film layers included in the insulating layer structure in the opening area OA of the active area AA, and, thus, color coordinates are greatly changed as a viewing angle is changed. Therefore, oscillation of color reproduction depending on a viewing angle is increased, which may result in deterioration of display quality of the display device.

Meanwhile, a display device used in FIG. 10B has the structure illustrated in FIG. 7. Specifically, FIG. 10B is a graph showing a variance in color coordinate depending on a viewing angle of the display device in which an insulating layer structure in the non-active area NAA and the non-opening area NOA of the active area AA is disposed differently from an insulating layer structure in the opening area OA of the active area AA. Likewise, it can be seen that if a specific white light which includes peak wavelengths in a red wavelength range, a green wavelength range, and a blue wavelength range and in which a peak wavelength in the red wavelength range has a narrower FWHM than peak wavelengths in the other wavelength ranges is supplied to the display device having the structure of the exemplary embodiment, a variation in color coordinate is decreased as a viewing angle is changed, as shown in FIG. 10B.

Therefore, as shown in FIG. 7 through FIG. 9, in the display device according to another exemplary embodiment of the present disclosure, all of the plurality of first sub-insulating layers 731 and 734 and the plurality of second sub-insulating layers 732 and 733 may be disposed in the non-active area NAA and the non-opening area NOA of the active area AA, and only the plurality of second sub-insulating layers 732 and 733 may be disposed in the opening area OA of the active area AA or only one first sub-insulating layer 731 or 734 may be further disposed. Thus, the number of interfaces with a difference in refractive index in the opening area OA of the active area AA can be reduced, so that there is almost no change in color coordinate. Therefore, it is possible to improve display quality of the display device and also possible to protect characteristics and reliability of the oxide semiconductor.

Further, in the display device 600 according to another exemplary embodiment of the present disclosure, the plurality of first sub-insulating layers 731 and 734 is disposed on and under the active layers 740G and 740N in the non-active area NAA and the non-opening area NOA of the active area AA in which the active layers 740G and 740N is disposed. Thus, deterioration of electrical characteristics of the active layers 740G and 740N can be reduced, so that deterioration of reliability of the display device can be reduced.

Furthermore, in the display device 600 according to another exemplary embodiment of the present disclosure, the plurality of second sub-insulating layers 732 and 733 is interposed between the active layers 740G and 740N disposed in the non-active area NAA and the non-opening area NOA of the active area AA and the plurality of first sub-insulating layers 731 and 734 disposed on and under the active layers 740G and 740N. Thus, defects of the active layers 740G and 740N which may occur during a deposition process of the plurality of first sub-insulating layers 731 and 734 can be reduced.

As described above, in a display device in which a specific light including a plurality of peak wavelengths is supplied to a liquid crystal panel in order to implement high resolution, if one of the plurality of peak wavelengths has a narrow full width at half maximum (FWHM), an insulating layer structure in a pixel area is configured differently from an insulating layer structure in a non-pixel area, so that oscillation of transmittance and change in color coordinate of a light having the peak wavelength with a relatively narrow FWHM depending on a viewing angle can be reduces. Therefore, oscillation of color reproduction of the display device depending on a viewing angle can be reduced, so that display quality of the display device can be improved.

The number of insulating layers of the insulating layer structure in the pixel area may be smaller than the number of insulating layers of the insulating layer structure in the non-pixel area.

The insulating layer structure in the pixel area may include at least one of the first insulating layer, the second insulating layer, and the third insulating layer formed of a material substantially identical to the substrate in refractive index.

An electrode unit includes a common electrode and a pixel electrode patterned on the common electrode, and an end of the common electrode may define a boundary line that separates the pixel area from the non-pixel area.

An end of a second insulating layer of the insulating layer structure in the non-pixel area may be located closer to the end of the common electrode than an end of the first insulating layer.

The end of the second insulating layer of the insulating layer structure in the non-pixel area and the end of the first insulating layer may be located on the same plane.

In the pixel area, a curve of transmittance oscillation of a light having the first peak wavelength depending on a viewing angle and a curve of transmittance oscillation of a light having the second peak wavelength depending on a viewing angle may have similar forms.

The second insulating layer of the insulating layer structure in the non-pixel area may be configured to cover a lateral surface of the first insulating layer.

The first insulating layer may be a gate insulating layer or an interlayer insulating layer, the second insulating layer may be a passivation layer, the third insulating layer may be a planarization layer, and the second insulating layer and the third insulating layer may include a contact portion that connects the electrode unit and the thin film transistor.

The first peak wavelength may be 430 nm or more to 480 nm or less or 520 nm or more to 560 nm or less, and the second peak wavelength may be 600 nm or more to 650 nm or less.

A specific light of the light source may include a first peak wavelength and a second peak wavelength having a full width at half maximum which is 25% or less of a full width at half maximum of the first peak wavelength.

The first peak wavelength may be 430 nm or more to 480 nm or less or 520 nm or more to 560 nm or less, and the second peak wavelength may be 600 nm or more to 650 nm or less.

The second insulating layer may be configured to cover a lateral surface of the first insulating layer.

A display device according to another exemplary embodiment of the present disclosure includes a substrate having an active area including an opening area configured to transmit a light and a non-opening area adjacent to the opening area and configured not to transmit a light and a non-active area which is adjacent to the active area and in which a gate-in-panel is disposed, a first sub-insulating layer disposed in the non-opening area of the active area and in the non-active area and having a first refractive index, and a second sub-insulating layer disposed in the entire active area and the entire non-active area and having a second refractive index lower than the first refractive index.

The display device further includes a first insulating layer configured to insulate a driving thin film transistor in the non-opening area and a gate electrode and an active layer disposed on the gate-in-panel in the non-active area, and a second insulating layer disposed on the driving thin film transistor in the non-opening area and a source electrode and a drain electrode disposed on the gate-in-panel in the non-active area, and the active layer may be formed of oxide semiconductor.

The first insulating layer may include a plurality of sub-insulating layers, and the first sub-insulating layer may be one of the first insulating layer, and the first sub-insulating layer may be formed of silicon nitride (SiNx).

The second insulating layer may include a plurality of sub-insulating layers, and the first sub-insulating layer may be one of the second insulating layer, and the first sub-insulating layer may be formed of silicon nitride (SiNx).

The second sub-insulating layer may be one of the plurality of sub-insulating layers constituting the first insulating layer or the plurality of sub-insulating layers constituting the second insulating layer, and the second sub-insulating layer may be formed of silicon oxide ($SiO_2$).

The first sub-insulating layer may be further extended to the opening area beyond a boundary between the non-opening area and the opening area in the active area, and a length of the first sub-insulating layer to be further extended to the opening area may be determined on the basis of color coordinates of a pixel including the opening area and the non-opening area.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a liquid crystal panel including a pixel area and a non-pixel area; and
a light source configured to supply the liquid crystal panel with a specific light including a first peak wavelength and a second peak wavelength having a full width at half maximum which is 25% or less of a full width at half maximum of the first peak wavelength, wherein the second peak wavelength has a maximum transmittance and a minimum transmittance in the pixel area between a viewing angle of 0 degrees and 70 degrees, and a difference between the maximum transmittance and the minimum transmittance is about 15% or less, and wherein the liquid crystal panel includes:

a thin film transistor including a gate electrode, an active layer, a source electrode, and a drain electrode on a non-pixel area of a substrate;

an insulating layer structure including at least one of a first insulating layer that insulates the gate electrode from the source electrode and the drain electrode of the thin film transistor, a second insulating layer that covers the source electrode and the drain electrode of the thin film transistor, and a third insulating layer that has a flat top surface on the second insulating layer; and an electrode unit configured to drive a liquid crystal layer on the insulating layer structure, and the insulating layer structure in the pixel area is configured differently from the insulating layer structure in the non-pixel area by having a different number of insulating layers in order to reduce oscillation of transmittance depending on a viewing angle when the specific light of the light source passes through the pixel area, wherein the insulating layer structure in the pixel area includes a material having a refractive index that is substantially identical to a refractive index of the substrate.

2. The display device of claim 1, wherein the number of insulating layers of the insulating layer structure in the pixel area is smaller than the number of insulating layers of the insulating layer structure in the non-pixel area.

3. The display device of claim 2, wherein the insulating layer structure in the pixel area includes at least one of the first insulating layer, the second insulating layer, and the third insulating layer formed of the material having the refractive index that is substantially identical to the refractive index of the substrate.

4. The display device of claim 3, wherein the electrode unit includes a common electrode and a pixel electrode patterned on the common electrode, and an end of the common electrode defines a boundary line that separates the pixel area from the non-pixel area.

5. The display device of claim 4, wherein an end of a second insulating layer of the insulating layer structure in the non-pixel area is located closer to the end of the common electrode than an end of the first insulating layer.

6. The display device of claim 4, wherein an end of the second insulating layer of the insulating layer structure in the non-pixel area and an end of the first insulating layer are located on the same plane.

7. The display device of claim 3, wherein a curve of transmittance oscillation of a light having the first peak wavelength depending on a viewing angle and a curve of transmittance oscillation of a light having the second peak wavelength depending on a viewing angle in the pixel area have similar forms.

8. The display device of claim 3, wherein the second insulating layer of the insulating layer structure in the non-pixel area is configured to cover a lateral surface of the first insulating layer.

9. The display device of claim 3, wherein the first insulating layer is a gate insulating layer or an interlayer insulating layer, the second insulating layer is a passivation layer, the third insulating layer is a planarization layer, and the second insulating layer and the third insulating layer include a contact portion that connects the electrode unit and the thin film transistor.

10. The display device of claim 3, wherein the first peak wavelength is 430 nm or more to 480 nm or less or 520 nm or more to 560 nm or less, and the second peak wavelength is 600 nm or more to 650 nm or less.

11. The display device of claim 1, wherein the third insulating layer includes the material having the refractive index that is substantially identical to the refractive index of the substrate.

12. The display device of claim 1, wherein the flat top surface of the third insulating layer and a top surface of the insulating layer structure are substantially coplanar.

13. A thin film transistor including a gate electrode, an active layer, a source electrode, and a drain electrode on a non-pixel area of a substrate, comprising:

a first insulating layer that insulates the gate electrode from the source electrode and the drain electrode;

a second insulating layer that covers the source electrode and the drain electrode, wherein the first insulating layer and the second insulating layer are configured not to be extended to a pixel area of the substrate in order to reduce oscillation of transmittance depending on a viewing angle which occurs when a specific light of a light source passes through the pixel area, wherein the specific light of the light source includes a first peak wavelength and a second peak wavelength having a full width at half maximum which is 25% or less of a full width at half maximum of the first peak wavelength, and wherein the second peak wavelength has a maximum transmittance and a minimum transmittance in the pixel area between a viewing angle of 0 degrees and 70 degrees, and a difference between the maximum transmittance and the minimum transmittance is about 15% or less.

14. The thin film transistor of claim 13, wherein the first peak wavelength is 430 nm or more to 480 nm or less or 520 nm or more to 560 nm or less, and the second peak wavelength is 600 nm or more to 650 nm or less.

15. The thin film transistor of claim 13, wherein the second insulating layer is configured to cover a lateral surface of the first insulating layer.

16. The thin film transistor of claim 13, further comprising an organic insulating layer structure in the pixel area of the substrate, wherein the organic insulating layer structure in the pixel area has a refractive index that is substantially identical to a refractive index of the substrate.

17. A display device, comprising:

a substrate having an active area including an pixel area configured to transmit a light and a non-pixel area adjacent to the pixel area and configured not to transmit the light and a non-active area which is adjacent to the active area and in which a gate-in-panel is disposed;

a light source configured to supply the light, the light including a first peak wavelength and a second peak wavelength, wherein the first peak wavelength and the second peak wavelength are different wavelengths, and wherein the second peak wavelength has a maximum transmittance and a minimum transmittance in the pixel area between a viewing angle of 0 degrees and 70 degrees, and a difference between the maximum transmittance and the minimum transmittance is about 15% or less, a first sub-insulating layer disposed in the non-pixel area of the active area and in the non-active area and having a first refractive index;

a second sub-insulating layer disposed in the entire active area and the entire non-active area and having a second refractive index lower than the first refractive index; and an insulating layer structure in the pixel area including a material having a refractive index that is substantially identical to a refractive index of the substrate.

18. The display device of claim 17, further comprising:
a first insulating layer configured to insulate a driving thin film transistor in the non-pixel area and a gate electrode and an active layer disposed on the gate-in-panel in the non-active area; and
a second insulating layer disposed on the driving thin film transistor in the non-pixel area and a source electrode and a drain electrode disposed on the gate-in-panel in the non-active area,
wherein the active layer is formed of oxide semiconductor.

19. The display device of claim 18, wherein the first insulating layer includes a plurality of sub-insulating layers,
the first sub-insulating layer is one of the plurality of sub-insulating layers of the first insulating layer, and the first sub-insulating layer is formed of silicon nitride (SiNx).

20. The display device of claim 19, wherein the second insulating layer includes a plurality of sub-insulating layers,
the first sub-insulating layer is one of the plurality of sub-insulating layers of the second insulating layer, and the first sub-insulating layer is formed of silicon nitride (SiNx).

21. The display device of claim 19, wherein the second sub-insulating layer is one of the plurality of sub-insulating layers constituting the first insulating layer or a plurality of sub-insulating layers constituting the second insulating layer, and
the second sub-insulating layer is formed of silicon oxide (SiO$_2$).

22. The display device of claim 17, wherein the first sub-insulating layer is further extended to the pixel area beyond a boundary between the non-pixel area and the pixel area in the active area, and a length of the first sub-insulating layer to be further extended to the pixel area is determined on the basis of color coordinates of a pixel including the pixel area and the non-pixel area.

23. The display device of claim 17, wherein the material of the insulating layer structure includes an organic material.

24. The display device of claim 17, wherein the second peak wavelength has a full width at half maximum which is 25% or less of a full width at half maximum of the first peak wavelength.

* * * * *